United States Patent [19]

Rusznyak

[11] Patent Number: 4,697,097
[45] Date of Patent: Sep. 29, 1987

[54] CMOS POWER-ON DETECTION CIRCUIT

[75] Inventor: Andreas Rusznyak, Chene-Bougeries, Switzerland

[73] Assignee: Motorola, Inc., Schaumburg, Ill.

[21] Appl. No.: 854,289

[22] Filed: Apr. 12, 1986

[51] Int. Cl.[4] .................. H03K 3/01; H03K 5/153; H03K 5/159; H03K 5/22
[52] U.S. Cl. ................ 307/296 R; 307/297; 307/350; 307/363
[58] Field of Search ............ 307/350, 363, 296 R, 307/297

[56] References Cited
U.S. PATENT DOCUMENTS
4,594,518  6/1986  Pollachek .................. 307/296 R Primary Examiner—John Zazworsky
Assistant Examiner—M. R. Wambach
Attorney, Agent, or Firm—Eugene A. Parsons

[57] ABSTRACT

A CMOS power-on detection circuit is described in which a rising supply potential is utilized to charge a capacitor and the voltage on the capacitor is coupled by one or more current mirrors to drive one of a pair of series connected complementary MOS transistors, a change in potential at a node between the transistors providing the power-on indication.

11 Claims, 2 Drawing Figures

CMOS POWER-ON DETECTION CIRCUIT

This invention relates to a CMOS power-on detection circuit for indicating when a rising supply potential reaches either a predetermined or a maximum value.

In copending United Kingdom Patent Application No. 8406687 there is described a CMOS power-on detection circuit which provides an output indication when the largest threshold voltage of the transistors in the circuit is exceeded.

The circuit of this copending application overcomes a problem of other known circuits in which detection is only made when the supply potential exceeds the sum of two threshold voltages and may provide a detection circuit in which no current is consumed by the circuit after detection.

Power-on detection on exceeding the largest threshold voltage can however be disadvantageous in certain circumstances. For example some logic circuits do not operate correctly at supply potentials which just exceed the threshold voltage. In such cases the power-on detection circuit of the above mentioned copending application would provide a power-on indication at a point in time in the rise of the supply potential at which the circuit is not fully operative.

This invention seeks to provide a power-on detection circuit on which the above mentioned disadvantages are mitigated.

According to this invention there is provided a CMOS power-on detection circuit comprising first and second supply lines; capacitive means in which a charging current is generated in response to a rising supply potential; first and second complementary MOS transistors connected in series between the first and second supply lines with their drain electrodes connected together to form a node, the gate electrode of the first transistor being connected so that the conductance of that transistor increases as the supply potential rises; means for driving the second transistor with a potential derived from the charging current, an indication of the supply potential having attained a predetermined or maximum value being provided by a predetermined potential change at the said node.

The charging current in the capacitive means may be generated through first diode means connected in series with the capacitive means between the first and second supply lines and forming a second node therebetween, the first diode means conveniently being formed by a third MOS transistor having its gate electrode connected to the second node.

The means for driving the second transistor may comprise current mirror means whereby current passed by the second transistor is a predetermined multiple of the charging current in the capacitive means.

In an embodiment of the invention the current mirror means includes a fourth MOS transistor and second diode means coupled in series between the first and second supply lines and having a third node therebetween, the third node being connected to the gate electrode of the second transistor, the gate electrode of the fourth transistor being connected to the second node and preferably the third and fourth transistors being of the same conductivity type.

The current mirror means preferably comprises a plurality of current mirrors.

The second diode means may be formed by a fifth MOS transistor having its gate electrode connected to the third node.

Output means may be coupled to the said node and conveniently the output means comprises inverting means.

Typically the inverting means are formed by two CMOS inverters.

Preferably additional means is provided responsive to the predetermined potential change at the said node for reducing current consumption by the circuit following said indication.

The additional means may comprise means for terminating current in the current mirror means.

An exemplary embodiment of the invention will now be described with reference to the drawings in which.

Figure 1:
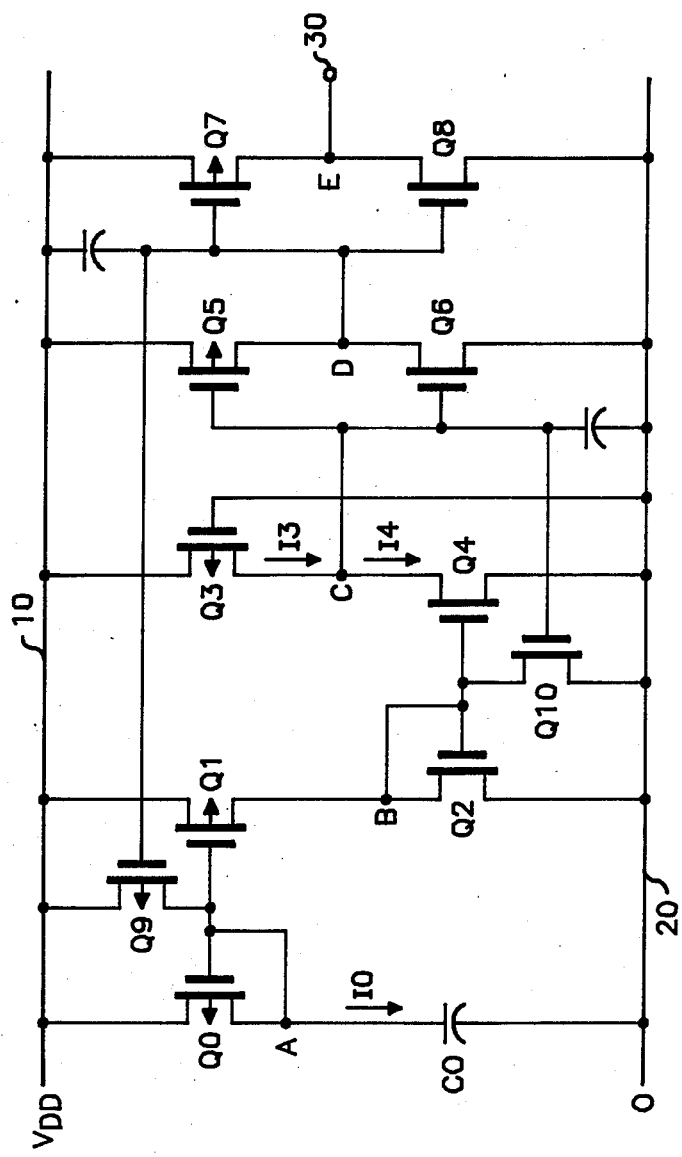
FIG. 1 shows a preferred embodiment of a power-on detection circuit in accordance with the present invention.

Referring now to FIG. 1 the circuit comprises first and second supply lines 10 and 20, the supply line 10 receiving a supply voltage VDD and the supply line 20 being a reference line, the supply voltage VDD being positive referenced to the reference line.

A capacitor C0 has a first terminal connected to the supply line 20 and its second terminal connected at node A to the drain electrode of a P-channel MOS transistor Q0 which has its drain electrode also connected to its gate electrode to form a diode and its source electrode connected to the supply line 10.

A pair of complementary MOS transistors Q1 and Q2 are connected in series between the supply lines 10 and 20 with the source electrodes of the transistors Q1 and Q2 respectively connected to the supply lines 10 and 20 and their drain electrodes coupled together to form a node B. The transistor Q2 which is the N-channel transistor of the pair also has its gate electrode connected to its drain electrode at the node B to form a diode and the gate of the P-channel transistor Q1 is connected to that of the transistor Q0.

A further pair of complementary MOS transistors formed by a P-channel transistor Q3 and an N-channel transistor Q4 are connected in series between the supply lines 10 and 20, the source electrodes of the transistors Q3 and Q4 being connected to the supply lines 10 and 20 respectively and the drain electrodes of the transistors being connected together to form a node C. The gate electrode of the transistor Q4 is connected to that of the transistor Q2 and the gate electrode of the transistor Q3 is connected to the supply line 20.

Figure 2:
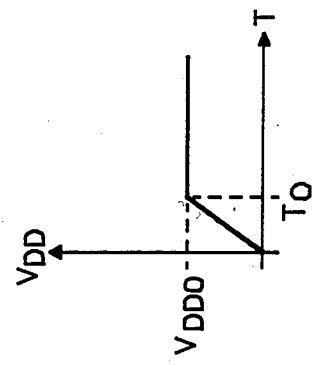
FIG. 2 is a graph illustrating the rise of the supply potential VDD with time for the circuit of FIG. 1.

Referring now to FIGS. 1 and 2 together, the instantaneous voltage VDD of the supply which is applied to the supply line 10 rises with time T following its application until it reaches a maximum value VDD0 at a time T0. This rising supply potential may be expressed as;

$$VDD = S \cdot T \text{ where } S = VDD0/T0$$

When the threshold voltage VT of the P channel transistor Q0 is exceeded the capacitor C0 will be charged through the diode connected transistor Q0 by a current I0 where;

$$I0 = S \cdot C0$$

By the action of a current mirror circuit formed by two current mirrors and which includes the complementary MOS transistors Q1 and Q2 the gate electrode of the transistor Q4 will be driven by a voltage derived from the instantaneous voltage on the capacitor C0 and the transistor Q4 is able to pass a saturation current I4 which is a multiple N of the charging current I0 of the capacitor C0.

This saturation current I4 of the transistor Q4 may therefore be expressed as $$I4 = N \cdot I0$$

where N is a predetermined multiplier.

As long as the current I4 is greater than the current I3 where $$I3 = K3 \, (VDD0 - VT)^2$$

K3 being a constant dependent upon the parameters of the transistor Q3, the voltage on the node C between the transistors Q3 and Q4 will be held close to the potential of the supply line 20, i.e. nearly at zero volts.

It is possible that the current I3 will exceed the current I4 at a point in time before that at which the supply potential stabilizes at its maximum value.

In this case the condition I4 exceeds I3 is reached when $$N \cdot S \cdot C0 = K3 (VDD - VT)^2$$

and the potential at the node C will change to VDD when $$VDD - VT = \sqrt{N \frac{S \cdot C0}{K3}}$$

In this way, the circuit will provide a power-on indication by means of a rapid change of the potential at the node C from zero to VDD when the rising supply potential has reached a predetermined value.

If the supply voltage VDD reaches its maximum value VDD0 before the condition $$N \cdot S \cdot C0 = K3 (VDD - VT)^2$$

has been reached, the current I0 charging the capacitor C0 will decrease and may be expressed by the equation $$I0 = \frac{K0}{\left[ \frac{K0}{C0} (T - T0) + \sqrt{\frac{K0}{S \cdot C0}} \right]^2}$$

where K0 is a constant defined by the equation $$I0 = K0 \, (V - VT)^2$$

The current I4 will become lower than the current I3 at a time T given by $$T - T0 = \frac{C0}{K0} \left[ \sqrt{\frac{N \cdot K0}{I3}} - \sqrt{\frac{K0}{S \cdot C0}} \right]$$

At this point the transistor Q3 conducts more strongly than the transistor Q4 and the voltage at the node C will switch to that of the supply potential VDD.

Consequently a change in the potential at the node C from zero volts to VDD provides an indication that the supply voltage has ceased to rise.

As described above the circuit provides a power-on indication by means of a change in the potential at the node C when the rising supply voltage has reached a predetermined value or a short time after the supply potential VDD has reached a maximum value.

In order to provide a suitable output signal from the circuit the node C between the transistors Q3 and Q4 is coupled to an output terminal 30 by two series connected CMOS inverters. The first of the inverters is formed by a P-channel transistor Q5 and an N channel transistor Q6 connected in series between the supply lines 10 and 20 and having their drain electrodes connected together to form a node D. The gate electrodes of the transistors Q5 and Q6 are connected together and to the node C. The second inverter is provided by a P channel transistor Q7 and an N channel transistor Q8 connected between the supply lines 10 and 20, the gate electrodes of which transistors are connected to the node D and the drain electrodes of which are connected together at a node E and to an output terminal 30. When the voltage at the node C rises to the potential VDD to indicate power-on, the potential at the output terminal 30 will also become VDD.

In order to cut current consumption by the circuit following the provision of a power-on detection signal at the output terminal 30 the node D is connected to the gate electrode of a P-channel MOS transistor Q9 whose source electrode is connected to the supply line 10 and whose drain electrode is connected to the gate electrode of the transistor Q1. Similarly the node C is connected to the gate electrode of a N-channel MOS transistor Q10 whose source eletectrode is connected to the supply line 20 and whose drain electrode is connected to the gate electrode of the transistor Q4.

When the potential at the node C becomes equal to the supply potential VDD the transistors Q9 and Q10 will be turned on thereby cutting off current through the transistors Q1 and Q4 so that the power-on detection circuit ceases to consume current when the power rising is over.

Nevertheless, once a detection is made by the circuit of the rise of the supply potential VDD applied to the supply line 10, the circuit will remain in a switched condition with the output terminal 30 providing an indicating output voltage equal to VDD until such time as the supply potential VDD falls below the threshold voltage VT.

The invention has been described by way of example and modifications may be made without departing from the scope of the invention. For example, although in the described embodiment the transistor Q4 is driven from the charging current developed in the capacitor C0 via two current mirrors, this is not essential and more or fewer mirrors may be employed. If desired no current mirror need be used in which case the transistors Q0 and Q4 would be of the same conductivity type with their gate electrodes connected together.

I claim:

1. A CMOS power-on detection circuit comprising first and second power supply lines; capacitive means coupled between said supply lines, in which a charging current is generated in response to a rising supply potential wherein the charging current in the capacitive means may be generated through first diode means connected in series with the capacitive means between the first and second supply lines and forming a first node therebetween; first and second complementary MOS transistors connected in series between the first and second supply lines with their drain electrodes connected together to form a second node, the gate electrode of the first transistor being coupled to one of said supply lines so that the conductance of that transisitor increases as the supply potential rises; means coupling said second transistor to said capacitive means for driving the second transistor with a potential derived from the charging current, an indication of the supply potential having attained a predetermined or maximum value being provided by a predetermined potential change at the said second node.

2. The circuit of claim 1 wherein the first diode means is formed by a third MOS transistor haing its gate electrode connected to the first node.

3. The circuit of claim 1 wherein output means is coupled to the said second node.

4. The circuit of claim 3 wherein the output means comprises inverting means.

5. The circuit of claim 4 wherein the inverting means is formed by two CMOS inverters.

6. The circuit of claim 1 wherein additional means is provided responsive to the predetermined potential change at the said second node for reducing current consumption by the circuit following said indication.

7. The circuit of claim 6 wherein the additional means comprises means for terminating current in the current mirror means.

8. A CMOS power-on detection circuit comprising first and second power supply lines; capacitive means coupled between said supply lines, in which a charging current is generated in response to a rising supply potential; first and second complementary MOS transistors connected in series between the first and second supply lines with their drain electrodes connected together to form a node, the gate electrode of the first transistor being coupled to one of said supply lines so that the conductance of that transistor increases as the supply potential rises; means coupling said second transistor to said capacitive means for driving the second transistor with a potential derived from the charging current, said means for driving the second transistor comprising current mirror means whereby current flowing through the second transistor is a predetermined multiple of the charging current in the capacitive means, an indication of the supply potential having attained a predetermined or maximum value being provided by a predetermined potential change at the said node.

9. The circuit of claim 8 wherein the current mirror means includes a fourth MOS transistor and second diode means coupled in series between the first and second supply lines and having a third node therebetween, the third node being connected to the gate electrode of the second transistor, the gate electrode of the fourth transistor being connected to the first node.

10. The circuit of claim 8 wherein the current mirror means comprises a plurality of current mirrors.

11. The circuit of claim 9 wherein the second diode means is formed by a fifth MOS transistor having its gate electrode connected to the third node.

* * * * *